United States Patent
Musha et al.

(10) Patent No.: US 9,869,565 B2
(45) Date of Patent: Jan. 16, 2018

(54) ROTATION DETECTION DEVICE AND METHOD OF MANUFACTURING ROTATION DETECTION DEVICE

(71) Applicant: Mitsubishi Electric Corporation, Tokyo (JP)

(72) Inventors: Takeshi Musha, Tokyo (JP); Yoshinao Tatei, Tokyo (JP); Yoshimasa Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/501,460

(22) PCT Filed: Apr. 23, 2015

(86) PCT No.: PCT/JP2015/062407
§ 371 (c)(1),
(2) Date: Feb. 3, 2017

(87) PCT Pub. No.: WO2016/170648
PCT Pub. Date: Oct. 27, 2016

(65) Prior Publication Data
US 2017/0227380 A1    Aug. 10, 2017

(51) Int. Cl.
*G01B 7/30*    (2006.01)
*G01D 5/20*    (2006.01)
*G01R 33/00*    (2006.01)

(52) U.S. Cl.
CPC ....... *G01D 5/2006* (2013.01); *G01R 33/0052* (2013.01)

(58) Field of Classification Search
CPC ..................................................... G01B 7/30
(Continued)

(56) References Cited

U.S. PATENT DOCUMENTS 3,820,090 A    6/1974  Wiegand
4,639,670 A *  1/1987  Normann .................... 324/260
(Continued)

FOREIGN PATENT DOCUMENTS

CN    101584116 A    11/2009
EP    0 856 855 A3    6/1999
(Continued)

OTHER PUBLICATIONS

International Search Report of PCT/JP2015/062407 dated Jun. 16, 2015 [PCT/ISA/210].
(Continued)

*Primary Examiner* — Bot Ledynh
(74) *Attorney, Agent, or Firm* — Sughrue Mion, PLLC; Richard C. Turner

(57) ABSTRACT

A magnet for detection mounted on a rotating shaft rotating about a rotation axis, and a detector disposed opposite to the magnet for detection to detect rotation of the rotating shaft are included. The detector includes a multi-layer circuit board, a recessed groove that is provided in an interlayer of the circuit board, has a center on an extension of the rotation axis, and is orthogonal to the rotation axis, a combined magnetic wire incorporated in the recessed groove and exhibiting a large Barkhausen effect, and a pickup coil formed of wiring conductors on the circuit board and a conductor with which through holes are filled, to surround the combined magnetic wire.

15 Claims, 12 Drawing Sheets

(58) Field of Classification Search
USPC .................................................... 324/207.25
See application file for complete search history.

(56) References Cited

U.S. PATENT DOCUMENTS

| | | | |
|---|---|---|---|
| 5,181,020 A * | 1/1993 | Furukawa et al. ............ | 340/551 |
| 7,372,261 B2 * | 5/2008 | Choi et al. .................... | 324/253 |
| 8,085,039 B2 | 12/2011 | Joisten et al. | |
| 2009/0309583 A1* | 12/2009 | Ruetz ....................... | 324/207.25 |
| 2011/0006757 A1* | 1/2011 | Mehnert .................... | 324/207.2 |
| 2011/0192087 A1 | 8/2011 | Tategami | |
| 2012/0187942 A1* | 7/2012 | Lee .......................... | 324/207.25 |
| 2015/0338245 A1 | 11/2015 | Tatei et al. | |

FOREIGN PATENT DOCUMENTS

| | | |
|---|---|---|
| JP | 57-067821 A | 4/1982 |
| JP | 63-117504 U | 7/1988 |
| JP | 63-277983 A | 11/1988 |
| JP | 10-223447 A | 8/1998 |
| JP | 2001-1 941 81 A | 7/2001 |
| JP | 2005-227297 A | 8/2005 |
| JP | 2008-014799 A | 1/2008 |
| JP | 2009-519452 A | 5/2009 |
| WO | 2014/128937 A1 | 8/2014 |

OTHER PUBLICATIONS

Communication dated Jul. 13, 2017 from the Taiwanese Intellectual Property Office in counterpart Application No. 105112409.

* cited by examiner

ROTATION DETECTION DEVICE AND METHOD OF MANUFACTURING ROTATION DETECTION DEVICE

CROSS REFERENCE TO RELATED APPLICATIONS

This application is a National Stage of International Application No. PCT/JP2015/062407, filed Apr. 23, 2015, the contents of which are incorporated herein by reference in its entirety.

FIELD

The present invention relates to a rotation detection device and a method of manufacturing the rotation detection device, and relates to a rotation detection device used for industrial FA equipment or automotive use, or in other various fields, in particular, a rotation detection device by self-power generation using a combined magnetic wire and a pickup coil.

BACKGROUND

A magnetic body of a double structure having a core part and a shell part is subjected to a solid solution treatment, a wire drawing process and a heat treatment which are repeatedly performed, and a twisting process to form a combined magnetic wire. The combined magnetic wire is known as exhibiting the so-called large Barkhausen effect, a phenomenon in which magnetization reversal may occur all at once near the boundary of the south and north poles of a magnet. By detecting the magnetization reversal of a combined magnetic wire using a pickup coil, a constantly uniform power generation pulse can be obtained regardless of the rotation speed of an object under detection such as a motor. Therefore, the combined magnetic wire is widely used in rotation detection device.

As a rotation number detector by self-power generation using a combined magnetic wire and a pickup coil, techniques are disclosed in Patent Literatures 1 to 3. A rotation number detector in Patent Literature 1 discloses a technique in which a magnet magnetized with a south pole and a north pole, and a power generation device of a combination of a combined magnetic wire having the large Barkhausen effect and a pickup coil are used to back up the power of the detector by power supply from the power generation device. In the power generation device, two power generation elements whose phase difference is 90 degrees with respect to one rotation are disposed.

The rotation number detector in Patent Literature 2 discloses a technique in which an even number of elements of wire-wound magnetic wires are disposed radially around a magnet, and inductance variations in the elements along with displacement of the magnet in a vertical direction are converted into electric signals.

The rotation number detector in Patent Literature 3 discloses a technique in which a plurality of power generation elements having combined magnetic wires and pickup coils is disposed such that the combined magnetic wires cross on a rotation center to determine a rotational direction.

CITATION LIST

Patent Literature

Patent Literature 1: Japanese Patent Application Laid-Open No. 2008-14799
Patent Literature 2: Japanese Utility Model Application Laid-Open No. 63-117504
Patent Literature 3: International Publication No. 2014-128937

SUMMARY

Technical Problem

In each of Patent Literatures 1 to 3, the power generation elements take a form where a coil made of a metal wire is wound around a combined magnetic wire, and the rotation detector has the power generation elements disposed on a circuit board to detect a current generated in the power generation elements. Each of Patent Literatures 1 to 3 has mainly two problems. The first is that, generally, a diameter of a combined magnetic wire is about 0.5 mm, and a diameter of a pickup coil wound around it is about 5 mm, so that in each of Patent Literatures 1 to 3, a space corresponding to a thickness of 5 mm or more is required on the circuit board, thus increasing the thickness of the detector. The second is that with respect to the length of a combined magnetic wire and a pickup coil for ensuring an amount of power generation, the length of a power generation element generally needs to be between about 10 mm and 20 mm inclusive, and it is required to provide a mounting space of between about 5 mm×10 mm and 20 mm inclusive on a circuit board to dispose a power generation element on the circuit board. It is needed to decrease in size of detectors year after year along with size reduction of apparatuses such as machine tools and higher-density arrangement of devices or the like. The above two problems hinder reduction in the thickness or the outer dimensions of detectors.

Further, in terms of detection accuracy, it is required to achieve a high-density arrangement while maintaining positional accuracy. However, there are limits to both positional accuracy and high-density arrangement, and it is difficult to provide a rotation detection device with small size and high detection accuracy.

The present invention has been made in view of the above, and has an object of providing a rotation detection device that is small not only in thickness but also in size and has high detection accuracy.

Solution to Problem

In order to solve the problems and achieve the object, according to an aspect of the present invention, there is provided a rotation detection device including: a magnet for detection mounted on a rotating body rotating about a rotation axis; and a detector disposed opposite to the magnet for detection, to detect rotation of the rotating body, the detector including: a multi-layer circuit board; a groove provided in an interlayer of the circuit board, having a center on an extension of the rotation axis, and being orthogonal to the rotation axis; a combined magnetic wire that is incorporated in the groove and exhibits a large Barkhausen effect; and a pickup coil formed of wirings on the circuit board and a conductor with which through holes are filled, and surrounding the combined magnetic wire.

Advantageous Effects of Invention

The present invention achieves an effect of being able to provide a rotation detection device that is small not only in thickness but also in size and has high detection accuracy.

DESCRIPTION OF EMBODIMENTS

Figure 1:
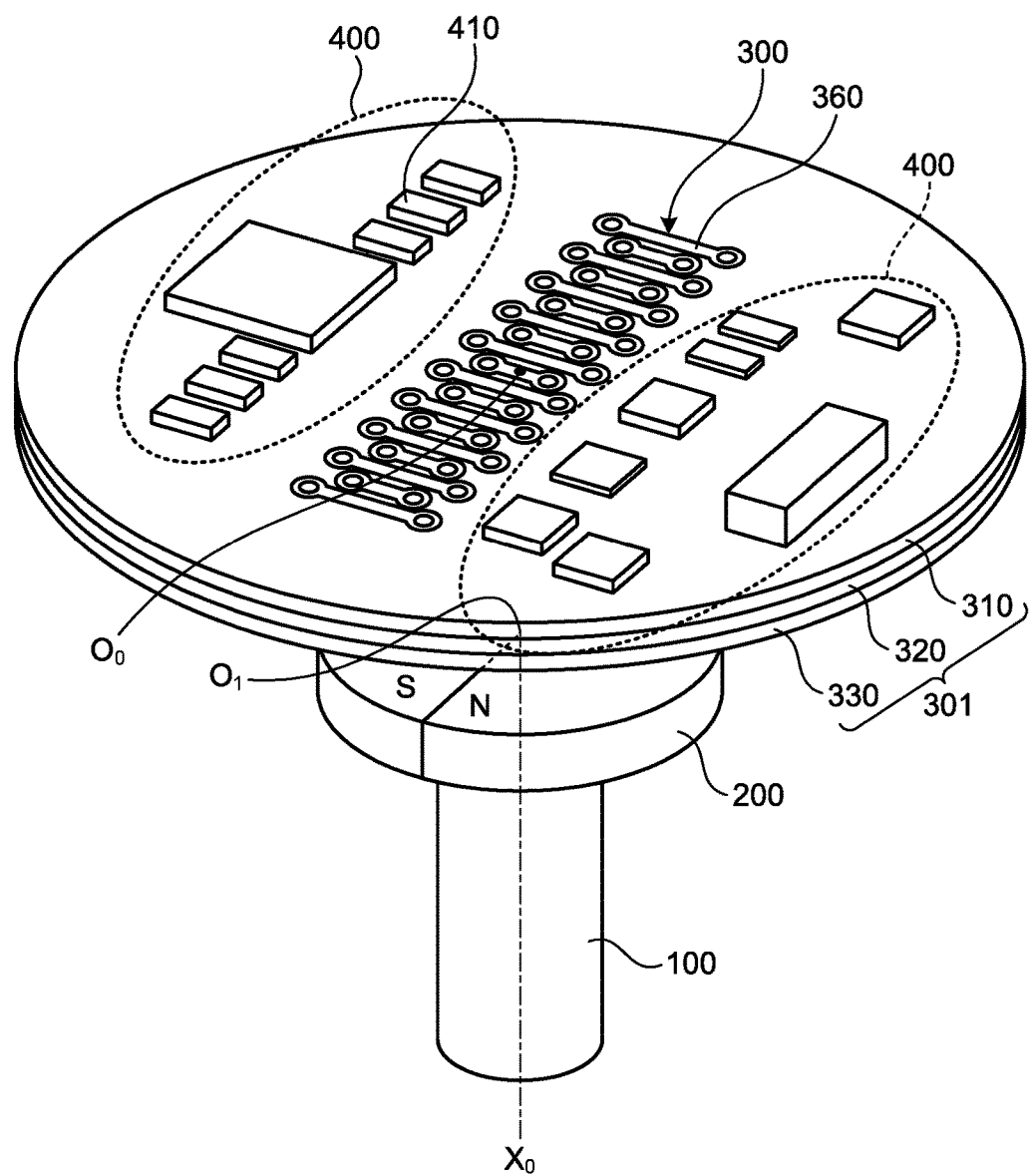
FIG. 1 is a perspective view illustrating the schematic configuration of a rotation detection device in a first embodiment.

Hereinafter, a rotation detection device and a method of manufacturing the rotation detection device according to embodiments of the present invention will be described in detail with reference to the drawings. These embodiments are not intended to limit this invention, and can be modified as appropriate without departing from the scope of the invention. In the drawings described below, scales of layers or members may be different from actual ones to facilitate understanding, and the same applies to those between the drawings. In some cross-sectional views, there is a case that hatching is not given to make the drawings easier to see.

First Embodiment

Figure 2:
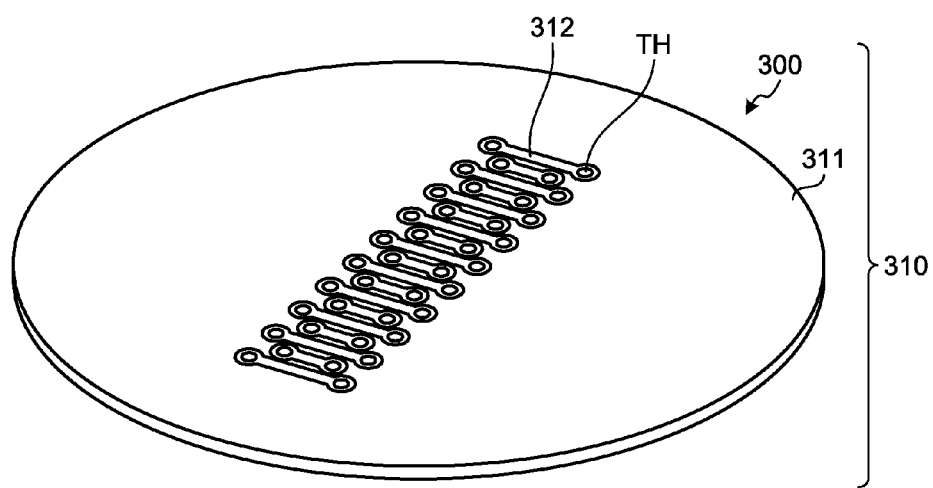
FIG. 2 is an exploded perspective view of the rotation detection device in the first embodiment.
Figure 2:
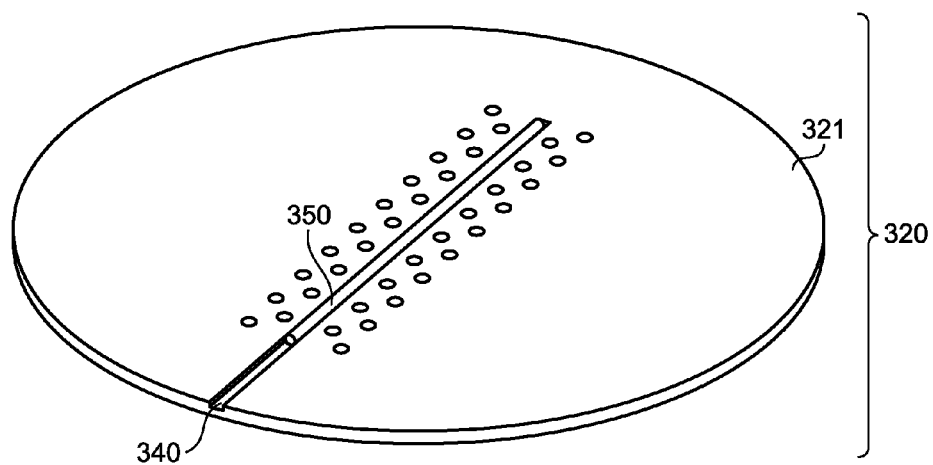
Figure 2:
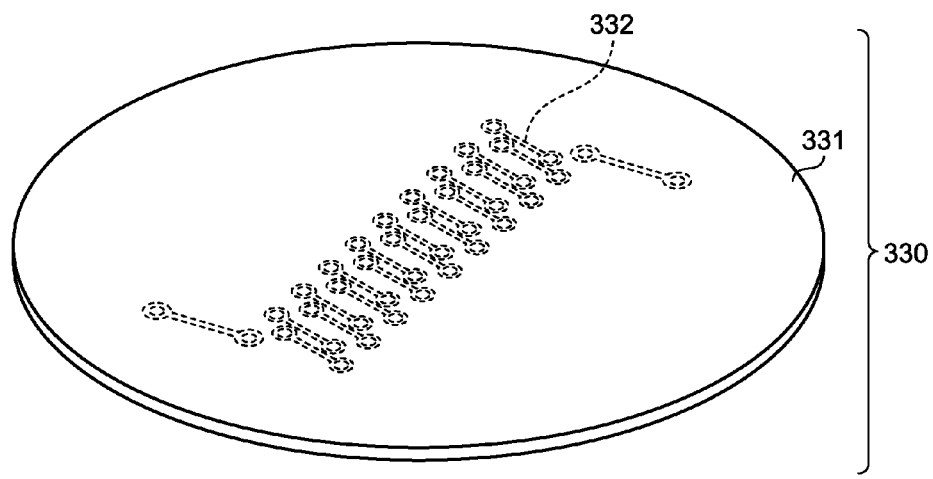
Figure 3:
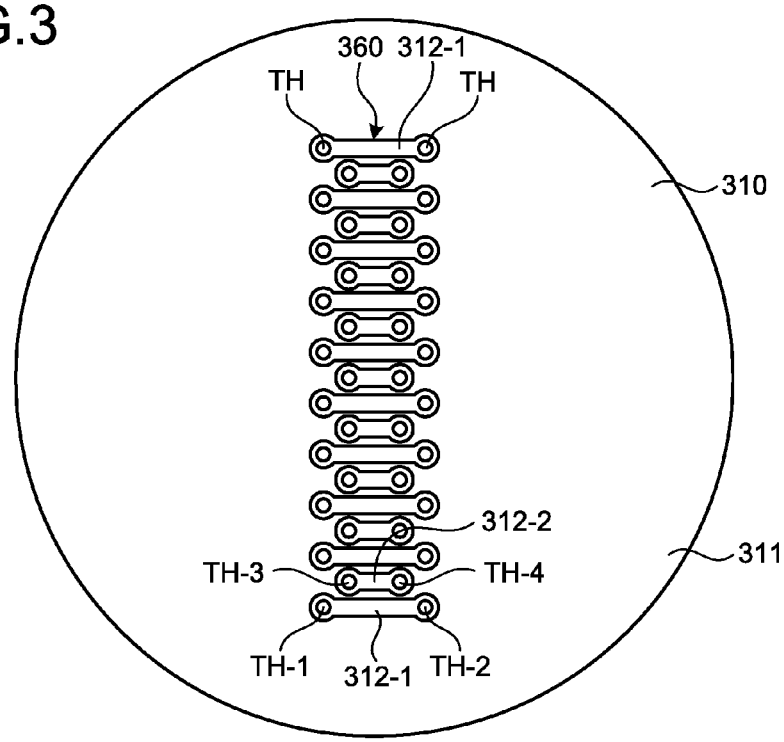
FIG. 3 is a top view illustrating an upper layer substrate of a circuit board of the rotation detection device in the first embodiment.
Figure 4:
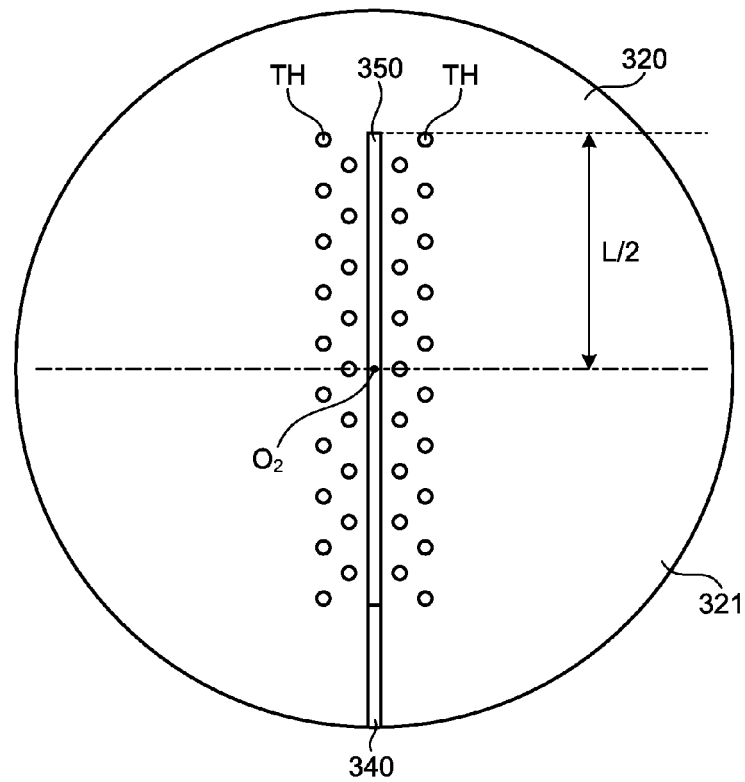
FIG. 4 is a top view illustrating an interlayer substrate of the circuit board of the rotation detection device in the first embodiment.
Figure 5:
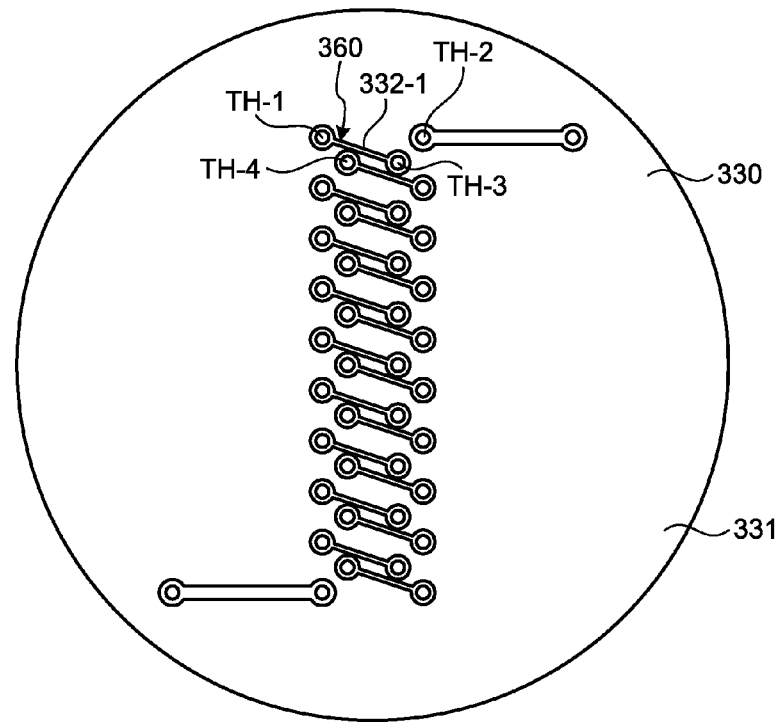
FIG. 5 is a bottom view illustrating a lower layer substrate of the circuit board of the rotation detection device in the first embodiment.
Figure 6:
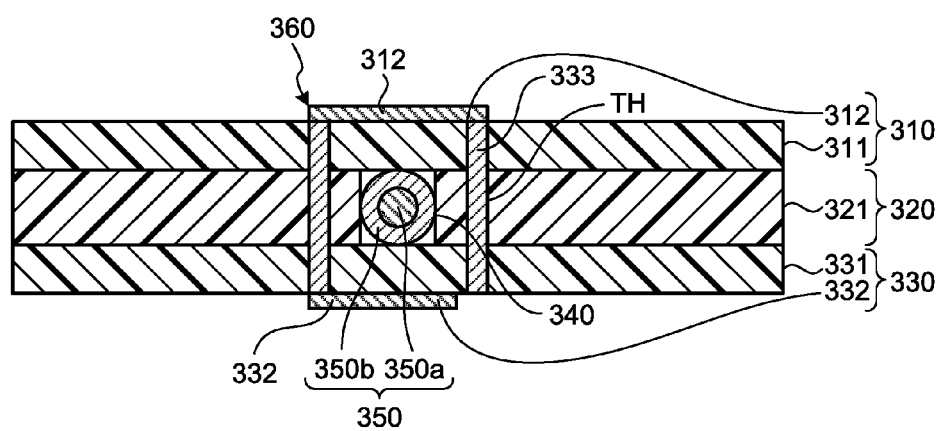
FIG. 6 is a cross-sectional view of the circuit board of the rotation detection device in the first embodiment.
Figure 7:
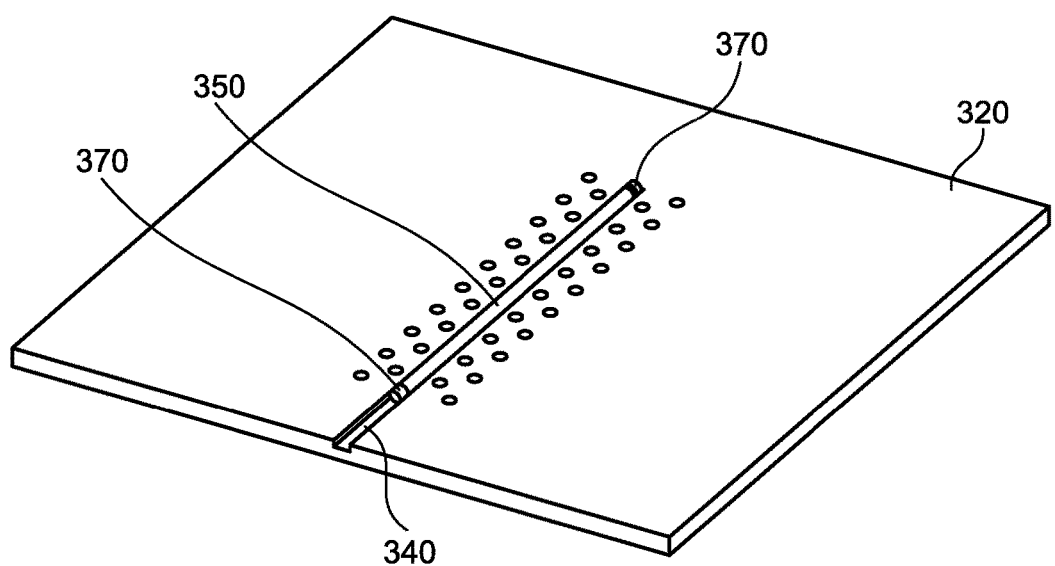
FIG. 7 is a diagram illustrating the fitted state of a combined magnetic wire in the rotation detection device in the first embodiment.

FIG. 1 illustrates a perspective view of the schematic configuration of a rotation detection device in the first embodiment. FIG. 2 is an exploded perspective view of the rotation detection device in the first embodiment. FIG. 3 is a top view illustrating an upper layer substrate of a circuit board of the rotation detection device in the first embodiment. FIG. 4 is a top view illustrating an interlayer layer substrate of the circuit board of the rotation detection device in the first embodiment. FIG. 5 is a bottom view illustrating a lower layer substrate of the circuit board of the rotation detection device in the first embodiment. FIG. 6 is a cross-sectional view of the circuit board of the rotation detection device in the first embodiment. FIG. 7 is a diagram illustrating the fitted state of a combined magnetic coil in the rotation detection device in the first embodiment. FIGS. 8(a) to 8(f) are cross-sectional views illustrating a process of manufacturing the circuit board of the rotation detection device in the first embodiment.

As illustrated in FIGS. 1 and 6, the rotation detection device of the present invention includes a magnet for detection 200 mounted on a rotating shaft 100 which serves as a rotating body rotating about a rotation axis $X_0$. The rotation detection device includes a detector 300 disposed opposite to the magnet for detection 200, for detecting the number of revolutions of the rotating shaft 100. The detector 300 is constituted by a circuit board 301 of a three-layer structure including an upper layer 310, an interlayer 320, and a lower layer 330. The detector 300 is constituted by: a recessed groove 340 that is provided in the interlayer 320 of the circuit board 301, has a center $O_0$ on an extension of the rotation axis $X_0$, and is orthogonal to the rotation axis $X_0$; a combined magnetic wire 350 that is incorporated in the recessed groove 340 and exhibits the large Barkhausen effect; and a pickup coil 360 surrounding the combined magnetic wire 350. The pickup coil 360 is formed of wirings 312 and 332 on the circuit board 301, and a conductor 333 with which through holes TH are filled. It is to be noted that circuit elements 410 constituting signal processing circuits 400 are mounted on the circuit board 301.

The magnet for detection 200 is mounted on the rotating shaft 100 to rotate integratedly with the rotating shaft 100. The combined magnetic wire 350 has, as illustrated in FIG. 6, a Vicalloy core part 350a and a Rimenda shell part 350b. A contact area between the core part 350a and the shell part 350b is plated by using nickel so as to make a magnetic body of a double structure. The magnetic body is subjected to a solid solution treatment, a wire drawing process and a heat treatment which are repeatedly performed, and a wire drawing process of 95% and a twisting process of five or six turns per meter to form the combined magnetic wire 350 to be used. The combined magnetic wire 350, which is disposed inside the circuit board 301 disposed opposite to the magnet for detection 200, causes magnetization reversal owing to the large Barkhausen effect along with the rotation of the magnet for detection 200.

The pickup coil 360, which is a built-in coil formed of the wirings and the through holes TH in a wiring substrate of a multi-layer structure, converts the magnetization reversal of the combined magnetic wire 350 into a voltage pulse. The signal processing circuit 400 processes pulse voltage from the pickup coil 360 by using the circuit elements 410 mounted on the circuit board 301. The signal processing circuit 400 includes, for example, a magnetic sensor for determining the rotational direction using the voltage pulses generated from the pickup coil 360; a counter for processing the pulse voltages generated from the pickup coil 360 so as to count the number of revolutions; a memory for storing a count value; a power generation circuit for driving those circuits using power of the pulse voltages generated from the pickup coil 360; and others.

The magnet for detection 200, which is a radially magnetized magnet magnetized with one south pole and one north pole, is mounted such that the center $O_1$ of the magnet for detection 200 substantially coincides with the rotation axis $X_0$ of the rotating shaft 100. The circuit board 301 is disposed above the magnet for detection 200, and is positioned such that the center $O_0$ of the combined magnetic wire 350 disposed in the central portion of the circuit board 301 is above the rotation axis $X_0$ of the rotating shaft 100.

Next, the detailed configurations of the circuit board 301, the combined magnetic wire 350, and the pickup coil 360 constituting the detector 300 for realizing the rotation detection device in the first embodiment will be described with reference to FIGS. 3 to 5. In FIGS. 3 to 5, the circuit board 301 is in a disk shape for explanatory convenience, but may be a substrate in a polygonal shape such as a quadrilateral shape or an octagonal shape. The circuit board 301 includes three layers. FIGS. 3 to 5 are a top view illustrating the upper layer 310 which is an upper layer substrate, a top view illustrating the interlayer 320 which is an interlayer substrate, and a bottom view illustrating the lower layer 330 which is a lower layer substrate, respectively. The upper layer 310 corresponding to the first layer of the circuit board 301 is constituted by, as illustrated in FIG. 3, a glass epoxy substrate which is an insulating substrate 311, and the wirings 312 formed by patterning a copper foil formed on the insulating substrate 311. The second layer, that is, the interlayer 320 has, as illustrated in FIG. 4, a glass epoxy substrate which is an insulating substrate 321, the recessed groove 340 formed in the insulating substrate 321, and the combined magnetic wire 350 fitted in the recessed groove 340. The lower layer 330 corresponding to the third layer is formed of, as illustrated in FIG. 5, a glass epoxy substrate which is an insulating substrate 331, and the wirings 332 formed by patterning a copper foil formed on the insulating substrate 331. And, the circuit board 301 is constituted by the through holes TH for connecting via the interlayer 320 between the wirings 312 on the upper layer 310 and the wirings 332 formed on the lower surface of the lower layer 330 corresponding to the third layer. As illustrated in FIGS. 3 and 5, for example, a wiring trace 312-1 constituting a part of the wirings 312 on the upper layer links between through holes TH-1 and TH-2, and a wiring trace 312-2 links between through holes TH-3 and TH-4. A wiring trace 332-1 constituting a part of the wirings 332 on the insulating substrate 331 of the lower layer 330 links between through holes TH-1 and TH-3. As above, the wiring trace on the upper layer 310 corresponding to the first layer and the wiring trace on the lower layer 330 corresponding to the third layer are united via the through holes TH, and thus the pickup coil 360 is formed.

FIG. 4 is a top view of the interlayer which is the interlayer substrate. The recessed groove 340 having a U-shaped cross section is formed in the center of the circuit board 301 in the second layer. Into the recessed groove 340, the combined magnetic wire 350 is disposed. The U shape from the center $O_2$ of the interlayer 320 to a longitudinal back end face of the recessed groove 340 having the U-shaped cross section has half the length L of the combined magnetic wire 350, that is, L/2. By butting the combined magnetic wire 350 against the longitudinal back end face of the U-shaped recessed groove 340, the longitudinal center of the combined magnetic wire 350 can be precisely aligned with the substrate center. After the combined magnetic wire 350 is butted against the back of the U shape in the second layer and the third layer, remaining space is filled with resin or the like to fix the combined magnetic wire 350.

Accordingly, a line passing through the rotation axis $X_0$ of the magnet for detection 200 is aligned with respect to the central part of the circuit board 301 by using a fixed member such as a housing, and thus the combined magnetic wire 350 can be disposed on the rotation center of the magnet, and a rotation detection device having the highest power generation efficiency and the highest detection efficiency can be realized.

FIG. 6 is a cross-sectional view illustrating a cross section of the circuit board 301 along a thickness direction. The wirings 312 and 332 are formed on the top surface of the upper layer 310 corresponding to the first layer and on the bottom surface of the lower layer 330 corresponding to the third layer, respectively. The wirings 312 and 332 respectively formed on the first layer and the third layer are connected via the through holes TH so as to form the pickup coil 360. The combined magnetic wire 350 is disposed in the U-shaped portion in the second layer.

Since a larger pulse voltage may be produced when the pickup coil 360 is wound nearby the combined magnetic wire 350, it is preferable that each of the insulating substrate 311 of the upper layer 310 and the insulating substrate 331 of the lower layer 330 has a thin thickness as much as possible.

It is to be noted that, like a configuration in a modification of the interlayer 320 illustrated in FIG. 7, stoppers 370 made of soft magnetic bodies of ferrite or the like may be fitted to both ends of the combined magnetic wire 350. In a configuration in which the combined magnetic wire 350 is inserted afterward, a stopper 370 is formed and embedded for one end only, and then the stopper 370 may be used as a stopper at the time of inserting the combined magnetic wire 350, by which positional accuracy can be increased along with magnetic collection effect. It is to be noted that, after the combined magnetic wire 350 is inserted, another stopper 370 made of a soft magnetic body may be inserted to reach the other end of the combined magnetic wire 350 to cover the other end.

Next, a method of manufacturing the rotation detection device in the first embodiment will be described. FIGS. 8(a) to 8(f) are process cross-sectional drawings illustrating a process of manufacturing the rotation detection device in the first embodiment. First, as illustrated in FIG. 8(a), a copper foil 312S, which will serve as the wirings 312, is stuck onto the insulating substrate 311 made of a glass epoxy substrate. Then, as illustrated in FIG. 8(b), the copper foil is patterned by using photolithography to form the wirings 312. A copper foil 332S, which will serve as the wirings 332, is likewise stuck onto the insulating substrate 331 constituting the lower layer 330, which is not illustrated. Then, the copper foil is patterned by using photolithography to form the wirings 332.

On the other hand, for the interlayer 320, as illustrated in FIG. 8(c), the insulating substrate 321 made of a glass epoxy substrate is prepared, and as illustrated in FIG. 8(d), the recessed groove 340 is formed by laser machining. The recessed groove 340 may be formed to pass through the interlayer 320.

Then, as illustrated in FIG. 8(e), the upper layer 310, the interlayer 320, and the lower layer 330 are stacked sequentially, and then subjected to a heat treatment.

Then, as illustrated in FIG. 8(f), laser irradiation is applied to the circuit board 301 to pass through the upper layer 310, the interlayer 320, and the lower layer 330 to form the through holes TH. Then the through holes TH are filled with a metal film corresponding to the conductor 333.

The combined magnetic coil 350 is inserted in the recessed groove 340 in the circuit board 301 formed in this manner. When inserting the combined magnetic wire 350, the combined magnetic wire 350 is inserted until it touches one stopper 370 made of ferrite at the back, and the other stopper 370 made of ferrite is fitted to the opening side. Then, positioning is performed with respect to the magnet for detection 200 formed on the top surface of the rotating shaft 100, and the circuit board 301 constituting the detector 300 is fixed by using a fixture not illustrated, to obtain the rotation detection device illustrated in FIG. 1.

As described above, the combined magnetic wire 350 is processed by the wire drawing process and the twisting process, and thus the combined magnetic wire 350 is likely to lose its characteristics under the application of stress. According to the rotation detection device of the first embodiment, after the circuit board 301 of the multi-layer wiring structure is formed using the interlayer 320 in which the recessed groove 340 is formed, the circuit board 301 is formed by inserting the combined magnetic wire 350 into the recessed groove 340. Therefore, it is possible to detect the rotation with high reliability without a decrease in measurement accuracy due to the loss of the characteristics. Further, the combined magnetic wire 350 is disposed in the recessed groove 340, and thus is protected from an external force not only during manufacturing but also during use, by which characteristic degradation of the combined magnetic wire 350 can be suppressed. Furthermore, only by disposing the combined magnetic wire 350 in alignment with the recessed groove 340, the positional relationship with the pickup coil 360 can be controlled with reliability.

The reliable alignment eliminates the need for a margin to accommodate misalignment, allowing the provision of a smaller and more highly reliable rotation detection device.

The pickup coil 360 has a configuration built in the circuit board 301 of the multi-layer wiring structure, as a combination of wiring traces, and thus the pickup coil 360 is in a fixed state. Therefore, it is possible to maintain very preferable positional accuracy.

In order to constitute the rotation detection device, it is required to mount a large number of electronic components on the surface of the circuit board 301. In the rotation detection devices disclosed in Patent Literatures 1 to 3, it is very difficult to ensure areas for implementing electronic components. By contrast, the rotation detection device of the first embodiment has a structure in which the pickup coil 360 and the combined magnetic wire 350 are built in the circuit board 301, and thus allows a large number of mounted components to be mounted on the surface, and allows reduction in thickness and size.

As above, the rotation detection device of the first embodiment can be greatly reduced in thickness, compared to a conventional detector having a coil wound around a combined magnetic wire. The pickup coil is formed by using the wiring traces on the substrate, and thus space for mounting components on the substrate can be saved. There is no need to mount an additional power generation element as a detector, resulting in suppress factors which may cause mounting failure. Thus an effect of improving reliability is achieved.

In the present embodiment, the circuit board 301 is illustrated in a form of three layers. The present embodiment is not limited to three layers, and may be a substrate of four or more layers, for example.

The circuit elements 410 constituting the signal processing circuit 400 are formed from common electronic components. Semiconductor integrated circuits (ICs) constituting the electronic components has a height of typically about 1 mm or more and less than 2 mm. When a conventional power generation element is used, a power generation element having an outer dimension of about 5 mm is mounted on a substrate. Therefore, there is a problem that the dimension of the rotation detection device in the thickness direction is increased due to the influence of the thicker power generation element in comparison with the other components. In the rotation detection device of the first embodiment, the detector corresponding to the power generation portion has the dimension in the thickness direction approximately equal to the substrate thickness, and thus it is possible to largely reduce in the dimension of the detector in the thickness direction.

Conventional power generation elements constituting a detector are fixed onto a circuit board by soldering. Since they are large in size and heavy, a decrease in reliability is feared due to vibration and the like. In the present embodiment, since the circuit board and the detector constituting the power generator are integrated, there is almost no increase in volume, and the weight is increased only due to the combined magnetic wire 350. There is almost no connection by soldering or the like, and the power generator can be realized by routing wiring traces. Therefore an improvement in reliability can be achieved with respect to vibration and impact. Further, in terms of weight and volume, it is difficult to constitute conventional power generation elements as surface-mounted components. In the present embodiment, since the power generator is integrated with the circuit board 301, all the ICs in the signal processing circuit 400 may be constituted by using surface-mounted components, by which the substrate mounting can be simplified.

It is to be noted that the highest power generation efficiency may be provided when the combined magnetic wire is disposed on the rotation center line of the magnet. To realize it, a portion for butting the combined magnetic wire is provided for a groove in which the combined magnetic wire is disposed, to align the magnet and the combined magnetic wire. In a specific method, it is desirable to provide a U-shaped groove in a substrate to butt a combined magnetic wire against it for alignment. However, it is needless to say that the combined magnetic wire does not necessarily need to be disposed on the rotation center line of the magnet, and may be somewhat misaligned for the sake of mounting other components.

The depth of the recessed groove 340 is appropriately selectable. By setting the thickness such that the total thickness of three layers of the insulating substrates 311, 321, and 331 equals the diameter of the combined magnetic wire, wobbling of the combined magnetic wire can be suppressed. This point will be described below.

Second Embodiment

Figure 9:
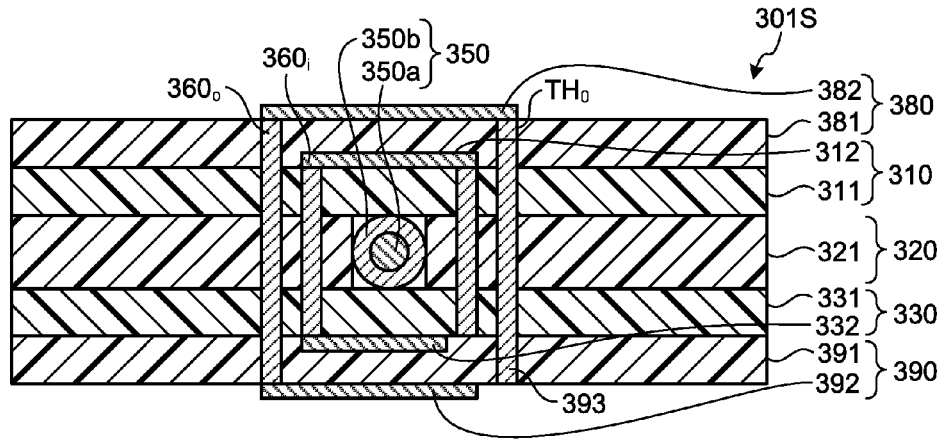
FIG. 9 is a cross-sectional view of a circuit board of a rotation detection device in a second embodiment.

The configuration of a rotation detection device of the second embodiment will be described below with reference to FIG. 9. FIG. 9 is a cross-sectional view of a circuit board of the rotation detection device in the second embodiment, and in particular illustrates a cross section of a power generator constituting a detector. The rotation detection device of the second embodiment is different from the first embodiment in a circuit board 301S constituting the detector.

In the rotation detection device of the second embodiment, the circuit board 301S is constituted by five layers. Wirings are disposed on the first, second, fourth, and fifth layers, and a combined magnetic wire 350 is disposed in the third layer. With respect to the combined magnetic wire 350, an inside pickup coil $360_i$ formed at the second and fourth layers and an outside pickup coil $360_o$ formed at the first and fifth layers are connected in series through a through hole. In the second embodiment, two pickup coils are wound around the combined magnetic wire 350 to obtain a larger pulse voltage. The combined magnetic wire 350 is constituted by a core part 350a and a shell part 350b. Descriptions are omitted for the other portions which are formed in a similar manner to those of the rotation detection device of the first embodiment. The same parts are denoted by the same reference numerals. The second layer, the third layer and the fourth layer correspond to the upper layer 310, the interlayer 320 and the lower layer 330 in the first embodiment, respectively. The first layer corresponds to an uppermost layer 380 and the fifth layer corresponds to a lowermost layer 390.

That is, the uppermost layer 380 and the lowermost layer 390 are additionally stacked on the outside of the upper layer 310 and the lower layer 330 of the rotation detection device of the first embodiment. The uppermost layer 380 includes wirings 382 formed by patterning a copper foil formed on an insulating substrate 381, in a similar manner to the upper layer substrate used in the first embodiment. The lowermost layer 390 includes wirings 392 formed by patterning a copper foil formed on an insulating substrate 391, in a similar manner to the lower layer 330 used in the first embodiment. Further, the outside pickup coil $360_o$ is formed by a metal conductor 393 with which outside through holes $TH_o$ passing through the wirings 382 of the uppermost layer 380 and the wirings 392 of the lowermost layer 390 are filled.

Figure 8:
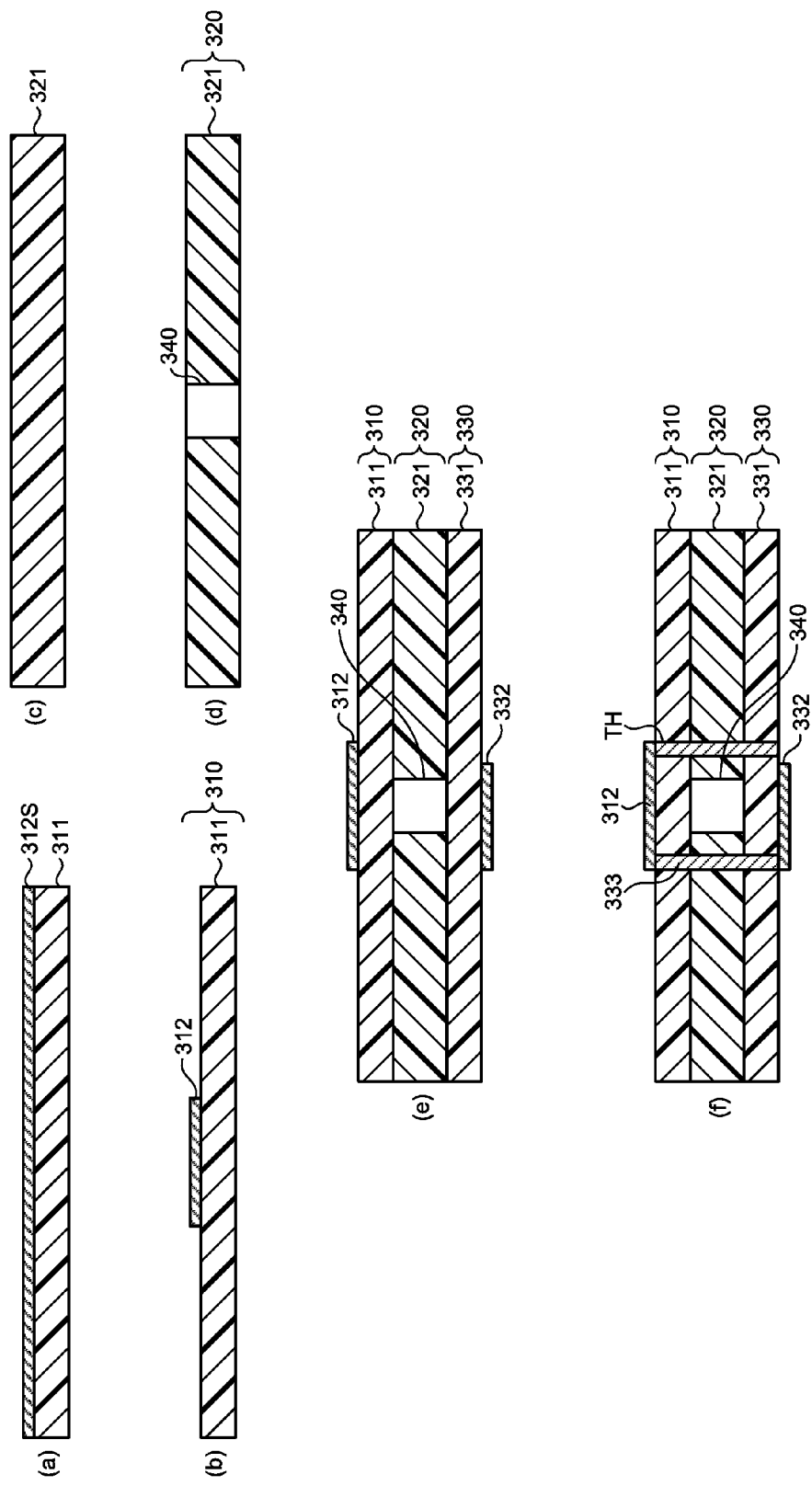
FIGS. 8(a) to 8(f) are cross-sectional views illustrating a process of manufacturing the circuit board of the rotation detection device in the first embodiment.

In a manufacturing process, in addition to steps in FIG. 8, material substrates constituting further two layers of the top uppermost 380 and the lowermost layer 390 are further stuck to the outside. Then, they are individually patterned by using photolithography. Thereafter, the outside through holes $TH_o$ passing from the uppermost layer 380 to the lowermost layer 390 are formed. Finally, the outside through holes $TH_o$ are filled with the metal conductor 393, and the combined magnetic wire 350 is inserted into a recessed groove 340 to form the detector illustrated in FIG. 9.

In recent years, multi-layer printed circuit board techniques such as the Patterned Prepreg Lay Up Process (PALAP) have been developed, by which it is possible to achieve the number of layers of more than 100 layers in a single printed circuit board. By using a printed circuit board of the ultra multi-layer structure, easy formation is possible as in the first embodiment. In this manner, it is possible to increase in the number of turns of a pickup coil and to obtain a larger pulse voltage compared to detection devices using conventional power generation elements. As a result, a large amount of power generation can be obtained, and detection accuracy can be improved.

It is to be noted that a pickup coil may be formed of a multi-layer coil such as a triple coil or a quadruple coil although the pickup coil is formed of a double coil in the second embodiment. By increasing the number of layers of a coil, it is possible to further increase the amount of power generation so as to improve the detection accuracy.

Third Embodiment

Figure 10:
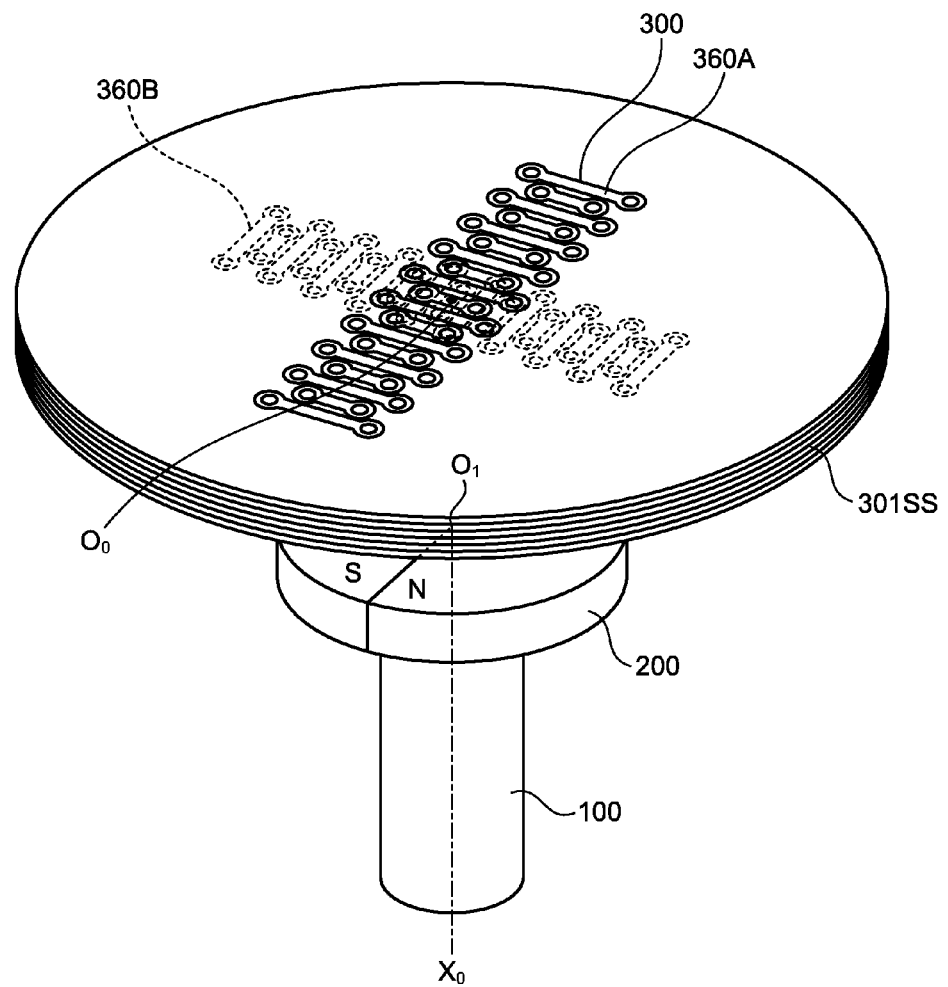
FIG. 10 is a perspective view illustrating the schematic configuration of a rotation detection device in a third embodiment.
Figure 11:
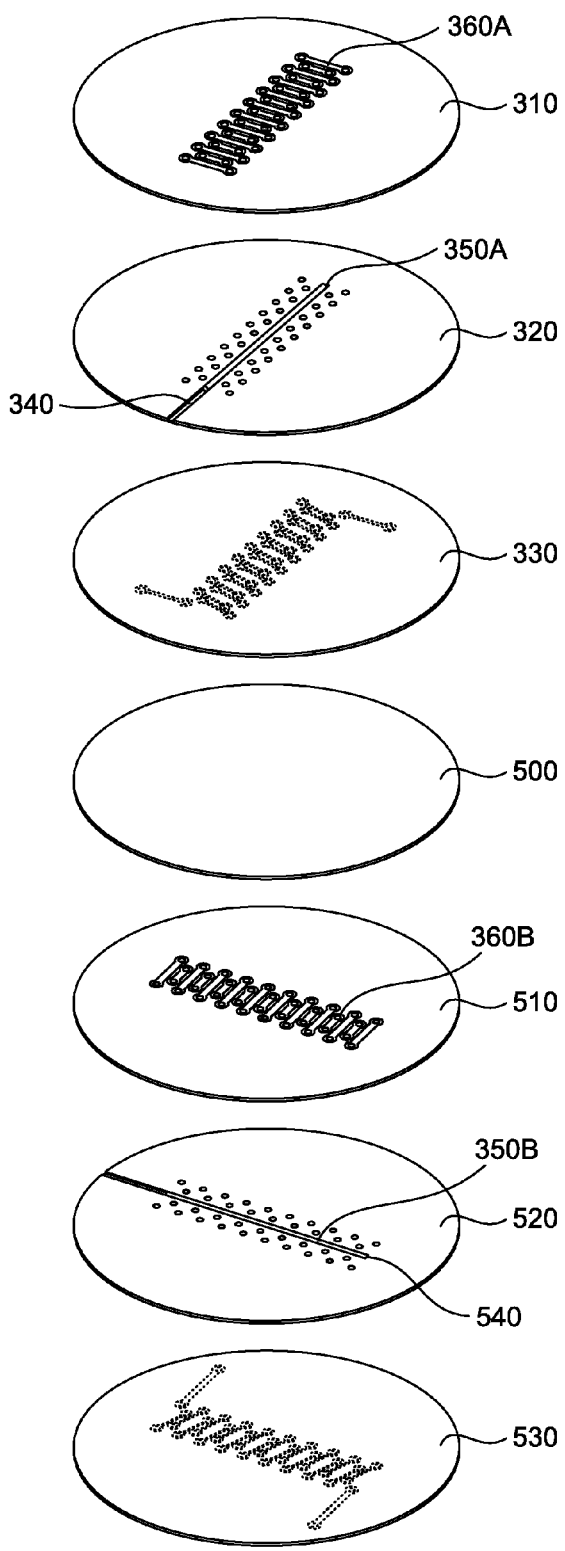
FIG. 11 is an exploded perspective view of the rotation detection device in the third embodiment.
Figure 12:
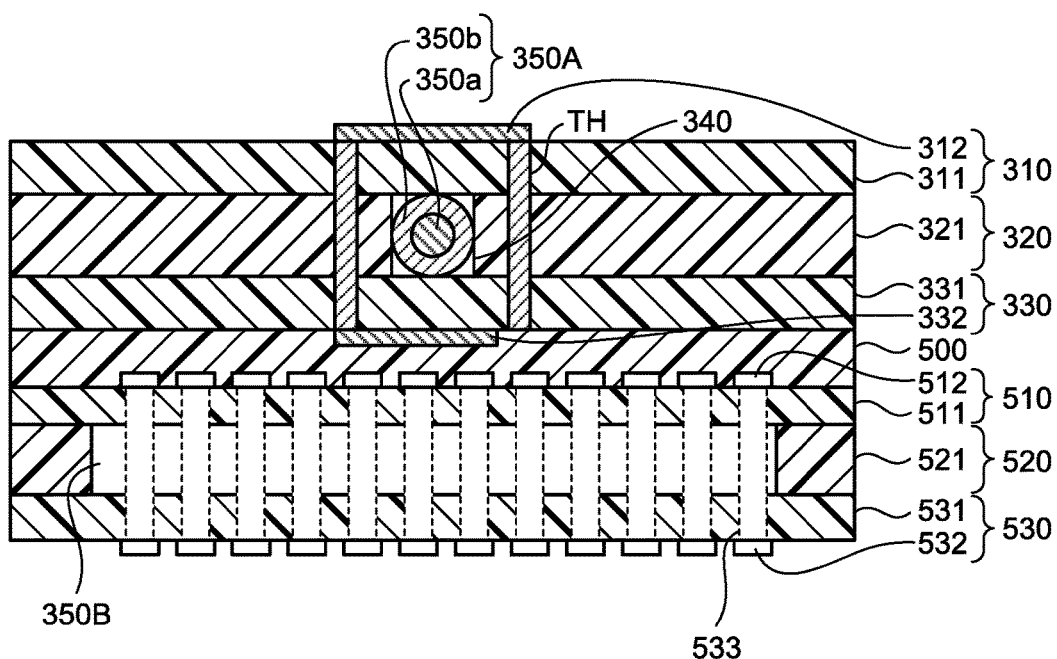
FIG. 12 is a cross-sectional view of a circuit board of the rotation detection device in the third embodiment.

A rotation detection device in the third embodiment of the present invention will be described. FIG. 10 is a perspective view illustrating the schematic configuration of the rotation detection device in the third embodiment. FIG. 11 is an exploded perspective view of the rotation detection device in the third embodiment. FIG. 12 is a cross-sectional view of a circuit board of the rotation detection device in the third embodiment. The rotation detection device in the third embodiment incorporates a first combined magnetic wire 350A and a second combined magnetic wire 350B which are orthogonal on the center axis of a circuit board 301SS. The circuit board 301SS enclosing the first combined magnetic wire 350A and the second combined magnetic wire 350B is a disk-shaped substrate having a center $O_0$ on an extension of a rotation axis $X_0$. A first pickup coil 360A and a second pickup coil 360B, which are formed of wirings in the circuit board 301SS and a metal conductor with which through holes are filled, are uniformly wound around along the length of the first combined magnetic wire 350A and the second combined magnetic wire 3503 over the entire length of the first combined magnetic wire 350A and the second combined magnetic wire 350B, respectively.

The third embodiment, in which a detector has a two-layer structure, is different from the first embodiment in that another combined magnetic wire orthogonal to the combined magnetic wire 350 is stacked underneath the detector having the combined magnetic wire 350 illustrated in the first embodiment. That is, the first combined magnetic wire 350A and the second combined magnetic wire 350B which is provided underneath the first combined magnetic wire 350A and orthogonal to the first combined magnetic wire 350A are stacked. The other portions are formed in a similar manner to the rotation detection device in the first embodiment. Their descriptions are herein omitted, and the same parts are denoted by the same reference numerals. The first layer, the second layer and the third layer correspond to the upper layer 310, the intermediate layer 320, and the lower layer 330 in the first embodiment, respectively. The fourth layer corresponds to a connection layer 500, the fifth layer corresponds to a lower-side upper layer 510, the sixth layer corresponds to a lower-side interlayer 520, and the seventh layer corresponds to a lower-side lower layer 530.

In the present embodiment, the circuit board 301SS is configured by seven layers. Pattern wirings are disposed on the first, third, fifth, and seventh layers. The first and second combined magnetic wires 350A and 350E are disposed in the second and sixth layers. A reversed magnetic field of the first combined magnetic wire 350A in the second layer is converted into a pulse voltage by the first pickup coil 360A on the first and third layers. A reversed magnetic field of the second combined magnetic wire 3503 in the sixth layer is converted into a pulse voltage by the second pickup coil 360B on the fifth and seventh layers. The first combined magnetic wire 350A and the second combined magnetic wire 350B are disposed such that they intersect at an angle of 90° therebetween when viewed from above.

That is, in the rotation detection device in the third embodiment, the connection layer 500, the lower-side upper layer 510, the lower-side interlayer 520, and the lower-side lower layer 530 are stacked underneath the lower layer 330 of the detector of the rotation detection device in the first embodiment. The connection layer 500 is configured by an insulating substrate. The lower-side upper layer 510 includes wirings 512 formed by patterning a copper foil formed on an insulating substrate 511 in a similar manner to the upper layer substrate used in the first embodiment. The lower-side interlayer 520 is provided by forming a recessed groove 540 in an insulating substrate 521. The lower-side lower layer 530 includes wirings 532 formed by patterning a copper foil formed on an insulating substrate 531, like the lower layer 330 used in the first embodiment. A laminated body including the lower-side upper layer 510, the lower-side interlayer 520, and the lower-side lower layer 530 is connected via the connection layer 500. Further, the second pickup coil 360B is formed by a metal conductor 533 with which through holes TH passing between the wirings 512 on the lower-side upper layer 510 and the wirings 532 on the lower-side lower layer 530 are filled. On the upper-layer side, as in the first embodiment, the first pickup coil 360A is formed by a metal conductor 333 with which through holes TH passing through the wirings 312 on the upper layer 310 and the wirings 332 on the lower layer 330 are filled. The first pickup coil 360A on the upper-layer side and the second pickup coil 360B on the lower-layer side are disposed in directions orthogonal to each other.

In a manufacturing process, first and second detectors formed in a similar manner as in the process in FIG. 8 are connected in orthogonal directions via the connection layer 500 to obtain the circuit board 301SS, in which the first and second combined magnetic wires 350A and 350B are inserted to form a detector illustrated in FIG. 12.

The rotational direction of magnets has a clockwise direction and a counterclockwise direction. A power generation element constituting a detector produces pulse voltage near the boundary of the south and north poles of a magnet. The pulse voltage of the power generation element usually outputs the same pulse regardless of the rotational direction of the magnet. Therefore, in order to determine the rotational direction, two power generation elements are disposed. The rotational direction can be determined by using a pulse voltage alternately produced from two channels.

When a plurality of power generation elements is disposed, disposing the power generation elements above the rotation center of a magnet provides the largest amount of power generation. In the conventional detection devices illustrated in Patent Literatures 1 to 3, two pickup coils physically interfere, and thus the pickup coils cannot be wound around and near the center of combined magnetic wires. Thus there is a problem that loss may be produced in power generation pulses to be obtained.

By contrast, in the rotation detection device in the third embodiment, the pickup coils can be wound around the first and second two combined magnetic wires 350A and 350B up to their centers, so that all magnetization reversals of the combined magnetic wires can be picked up by the pickup coils, the amount of power generation can be provided efficiently, and the thickness of the entire detection device can be reduced.

According to the rotation detection device in the third embodiment, by disposing a plurality of combined magnetic wires above the rotation center of a magnet for detection, power generation pulses can be obtained efficiently from a plurality of power generation elements, and the rotational direction can be easily detected.

Further, According to the rotation detection device in the third embodiment, it is not needed to dispose a magnetic sensor such as a Hall element for determining the rotational direction to determine the rotational direction as in the first embodiment, and thus the number of components to be mounted can be reduced.

In the present embodiment, a two-channel type form has been described using a seven-layer substrate and two combined magnetic wires. However, the present embodiment is not limited to this. For example, in order to perform correction for pulse missing as in Patent Literature 3, a three-channel type form can be realized using three combined magnetic wires and an eleven-layer substrate.

In the present embodiment, two combined magnetic wires are disposed such that they are orthogonal to each other. However, the present embodiment is not limited to this. The above object can be achieved unless the relative positional relationship between two combined magnetic wires is parallel.

Fourth Embodiment

Figure 13:
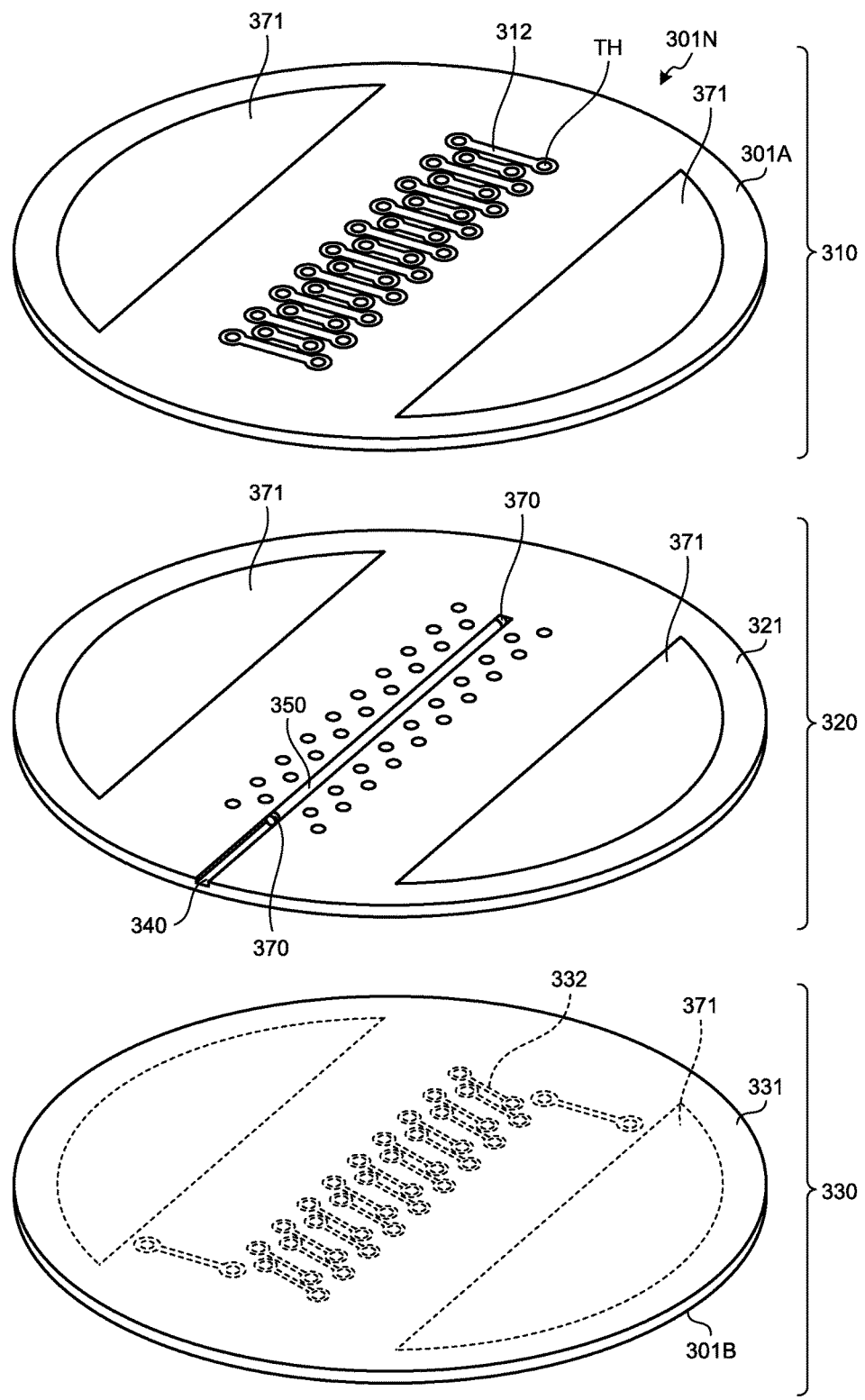
FIG. 13 is an exploded perspective view of a rotation detection device in a fourth embodiment.

The configuration of a rotation detection device in the fourth embodiment of the present invention will be described with reference to the exploded perspective view in FIG. 13. The fourth embodiment is different from the first embodiment in a power generation portion constituting a detector. A circuit board 301N has soft magnetic layers 371 on a second main surface 301B opposite to a magnet for detection and on a first main surface 301A opposite to the second main surface 301B. In an interlayer 320, stoppers 370 made of cylindrical soft magnetic bodies of ferrite or the like are provided at both ends of a combined magnetic wire 350. In the interlayer 320 constituting the second layer and a lower layer 330 constituting the third layer, a U-shaped opening is formed to have dimensions in accordance with the external form of the stoppers 370 made of soft magnetic bodies.

The present embodiment, in which the stoppers 370 made of cylindrical soft magnetic bodies are fitted to the both ends of the combined magnetic wire, thus can provide a larger pulse voltage and can increase the amount of power generation by the effect of collecting magnetic fields from the magnet compared to a combined magnetic wire alone.

The soft magnetic layers 371 are formed on both sides of the circuit board. The above configuration can collect magnetic fields from the magnet still more efficiently, and can increase detection sensitivity.

Fifth Embodiment

Figure 14:
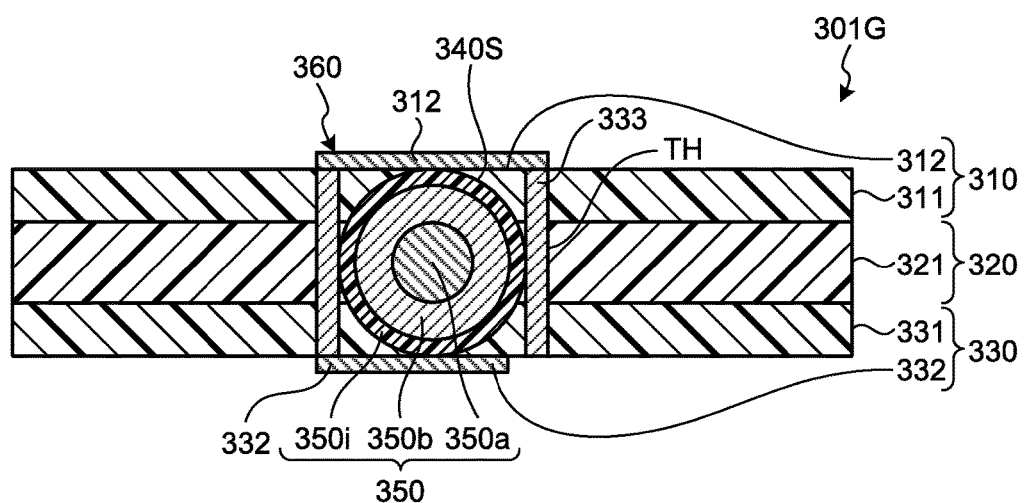
FIG. 14 is a cross-sectional view of a circuit board of a rotation detection device in a fifth embodiment.
Figure 15:
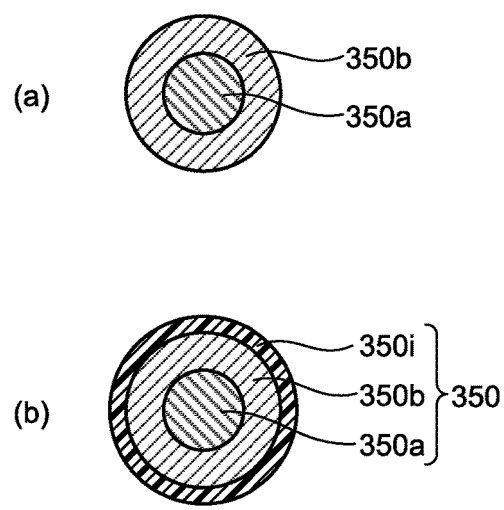
FIGS. 15(a) and 15(b) are process cross-sectional drawings illustrating a process of manufacturing a combined magnetic wire used in a process of manufacturing the rotation detection device in the fifth embodiment.

FIG. 14 is a cross-sectional view of a circuit board of a rotation detection device in the fifth embodiment. FIGS. 15(a) and 15(b) are process cross-sectional diagrams illustrating a process of manufacturing a combined magnetic wire used in a process of manufacturing the rotation detection device in the fifth embodiment. FIGS. 16(a) to 16(e) are process cross-sectional diagrams illustrating a process of manufacturing the circuit board of the rotation detection device in the fifth embodiment. The rotation detection device in the fifth embodiment is configured to adjust the depth of a recessed groove 340 and reduce the distance between a combined magnetic wire 350 and a pickup coil so as to increase power generation efficiency. The depth of the recessed groove 340 is appropriately selectable. By setting the total thickness of three layers of insulating substrates 311, 321, and 331 in accordance with the diameter of the combined magnetic wire 350, wobbling of the combined magnetic wire 350 can be suppressed, and a sensor having high power generation efficiency can be obtained. In the fifth embodiment, as illustrated in the cross-sectional diagram in FIG. 14, a circuit board 301G used is formed to have a recessed groove 340S for the combined magnetic wire insertion, the recessed groove 340S being formed by firing a laminated body of green sheets with a dummy rod D of the same diameter as that of the combined magnetic wire 350, the surface of which is coated with a mold release agent DR. On the other hand, as the combined magnetic wire, a combined magnetic wire 350 having a covering layer covered with an insulating layer 350i at the surface is used. It is to be noted that the diameter of the dummy rod D is set nearly equal to the diameter of the combined magnetic wire 350, and that the diameter is preferably made slightly larger to the extent that the combined magnetic wire 350 can be inserted when the dummy rod D is pulled out to insert the combined magnetic wire 350.

The circuit board 301G is formed of green sheets stacked and fired, and has an upper layer 310 constituting an upper layer substrate, an interlayer 320 constituting an interlayer substrate, and a lower layer 330 constituting a lower layer substrate. The recessed groove 340S is formed large across the upper layer 310, the interlayer 320, and the lower layer 330. The upper layer 310 corresponding to the first layer of the circuit board 301G is formed of a ceramic substrate constituting an insulating substrate 311 and wirings 312 formed by patterning a copper foil formed on the insulating substrate 311. The second layer, that is, the interlayer 320 is formed of a ceramic substrate constituting an insulating substrate 321. The lower layer 330 corresponding to the third layer is formed of a ceramic substrate constituting an insulating substrate 331 and wirings 332 formed by patterning a copper foil formed on the insulating substrate 331. Through holes TH are included for connecting the wirings 312 of the upper layer 310 and the wirings 332 formed on the bottom surface of the lower layer 330 in the third layer through the interlayer 320.

The layer configuration of each layer constituting the circuit board 301G is similar to that of the circuit board 301 in the first embodiment. The recessed groove 340S for combined magnetic wire insertion has a shape conforming to the outside diameter of the dummy rod D, so that the distance between the combined magnetic wire 350 and the pickup coil 360 can be suppressed to a minimum.

Next, a method of manufacturing the circuit board 301G in the fifth embodiment will be described. First, as illustrated in FIG. 15(a), a Rimenda shell part 350b is formed around a Vicalloy core part 350a. A contact area between the core part 350a and the shell part 350b is plated with nickel so as to form a double-structure magnetic body. The double-structure magnetic body is subjected to a solid solution treatment, a wire drawing process and a heat treatment which are repeated. The combined magnetic wire 350 is formed by using such a wire drawing process and a heat treatment.

After this, as illustrated in FIG. 15(b), an insulating covering layer, that is, the insulating layer 350i is formed on the outside of the combined magnetic wire 350.

Figure 16:
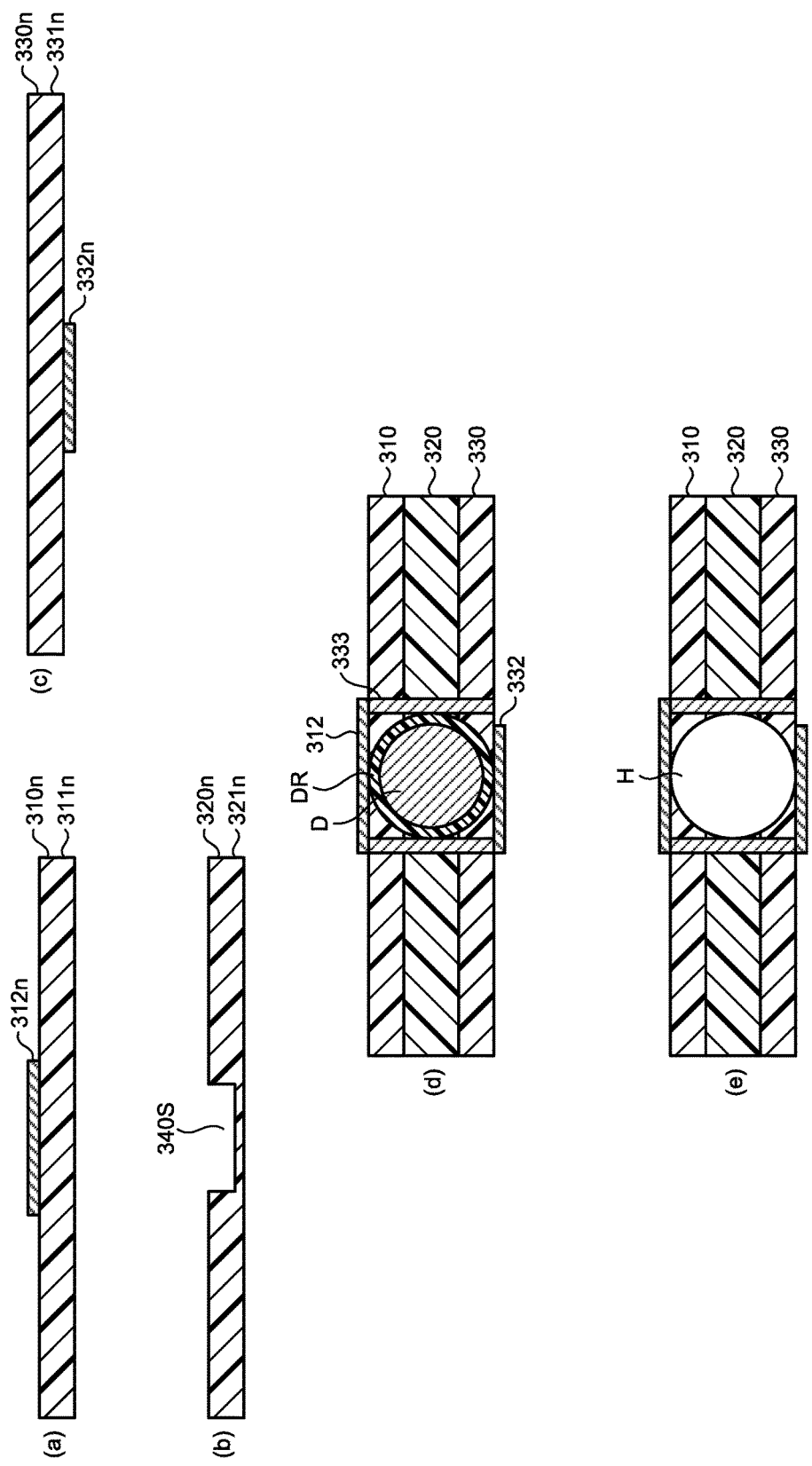
FIGS. 16(a) to 16(e) are process cross-sectional drawings illustrating a process of manufacturing the circuit board of the rotation detection device in the fifth embodiment.

For the circuit board 301G, at first, a wiring pattern 312n using a conductive paste such as a silver paste is printed on an insulating layer 311n made of a ceramic green sheet to form an upper layer green sheet 310n as illustrated in FIG. 16(a).

Then, a recess 340S for recessed groove formation is formed in a desired shape in an insulating layer 321n made of a ceramic green sheet to form an interlayer green sheet 320n as illustrated in FIG. 16(b).

Next, a wiring pattern 332n using a conductive paste such as a silver paste is printed on an insulating layer 331n made of a ceramic green sheet to form a lower layer green sheet 330n as illustrated in FIG. 16(c).

Then, the dummy rod D coated with the mold release agent DR is interposed, and next, the lower layer green sheet 330n, the interlayer green sheet 320n, and the upper layer green sheet 310n made of ceramic green sheets are stacked and fired while being pressurized to obtain a laminated body illustrated in FIG. 16(d).

Then, the dummy rod D coated with the mold release agent DR is pulled out to form a hole H having a circular cross section for combined magnetic wire insertion as illustrated in FIG. 16(e). Finally, the combined magnetic wire 350 covered with the insulating layer 350i illustrated in FIG. 15(b) is inserted into the hole H for combined magnetic wire insertion. In this manner, the rotation detection device illustrated in FIG. 14 can be obtained.

As above, in the fifth embodiment, the process of forming the laminated body includes a step of stacking and firing a plurality of ceramic green sheets on which wiring layers are formed together with a dummy rod interposed therebetween, and a step of pulling out the dummy rod after the firing step, forming a cavity corresponding to a recessed groove. A step of inserting a combined magnetic wire includes a step of covering the periphery of the combined magnetic wire with an insulating film, and a step of inserting the combined magnetic wire covered with the insulating film into the cavity.

In this configuration, the diameter of the dummy rod is made nearly equal to the diameter of the combined magnetic wire 350, and the diameter of the dummy rod D is made slightly larger to the extent that the combined magnetic wire 350 can be inserted when the dummy rod D is pulled out to insert the combined magnetic wire 350. Thus, by inserting the combined magnetic wire 350 covered with the insulating layer 350i into the recessed groove conforming to the outer periphery of the combined magnetic wire 350, the distance between the combined magnetic wire and the pickup coil can be made uniform and suppressed to a minimum. In addition, the through holes for forming the pickup coil are formed in positions as close to the position of the dummy rod as possible, so that the pickup coil in closer proximity to the combined magnetic wire 350 can be formed.

According to the rotation detection device of the fifth embodiment, the distance between the combined magnetic wire 350 and the pickup coil can be minimized, and a small, high-accuracy, high-reliability rotation detection device can be obtained.

In the first to fifth embodiments, the combined magnetic wire 350 is disposed in the groove that has the center on the extension of the rotation axis of the rotating shaft 100, and is orthogonal to the rotation axis. However, the combined magnetic wire 350 may be slightly eccentric. The misalignment can be compensated in the processing circuit.

Although several embodiments of the present invention have been described, these embodiments are presented as examples, and are not intended to limit the scope of the invention. These new embodiments can be implemented in other various forms, and various omissions, replacements, and changes can be made without departing from the scope of the invention. These embodiments and their modifications are included in the scope of the invention, and are included in the scope of the invention described in the claims and their equivalents.

REFERENCE SIGNS LIST 100 rotating shaft, 200 magnet for detection, 300 detector, 301S, 301SS, 301N circuit board, 310 upper layer, 311 insulating substrate, 312 wirings, 320 interlayer, 330 lower layer, 331 insulating substrate, 332 wirings, 340 recessed groove, 350 combined magnetic wire, 350A first combined magnetic wire, 350B second combined magnetic wire, 350*a* core, 350*b* shell, 350*i* insulating layer, 360 pickup coil, 360A first pickup coil, 360B second pickup coil, 360$_o$ outside pickup coil, 360$_i$ Inside pickup coil, 370 stopper, 371 soft magnetic layer, 380 uppermost layer, 381 insulating substrate, 382 wirings, 390 lowermost layer, 391 insulating substrate, 392 wirings, 400 signal processing circuit, 410 circuit element, 500 connection layer, 510 lower-side upper layer, 511 insulating substrate, 512 wirings, 520 lower-side interlayer, 530 lower-side lower layer, 531 insulating substrate, 532 wirings, TH through hole, $X_0$ rotation axis, $O_0$ center, $O_1$ center of the magnet for detection.

The invention claimed is:

1. A rotation detection device comprising:
a magnet for detection mounted on a rotating body rotating about a rotation axis; and
a detector configured to detect rotation of the rotating body,
the detector comprising:
   a multi-layer circuit board disposed opposite to the magnet for detection;
   a combined magnetic wire provided at an interlayer of the multi-layer circuit board, disposed on an extension of the rotation axis, and exhibiting a large Barkhausen effect;
   a pickup coil comprising wirings on the multi-layer circuit board, and a conductor with which through holes provided in the multi-layer circuit board are filled, the pickup coil surrounding the combined magnetic wire; and
   a groove provided in the interlayer of the multi-layer circuit board, having a center on the extension of the rotation axis, being orthogonal to the rotation axis, and extending to an edge of a periphery of the interlayer.

2. The rotation detection device according to claim 1, wherein the pickup coil is disposed around the groove.

3. The rotation detection device according to claim 1, wherein the pickup coil comprises:
an inner layer coil surrounding the combined magnetic wire; and
an outer layer coil surrounding the inner layer coil, and the inner layer coil and the outer layer coil are connected in series.

4. The rotation detection device according to claim 1, wherein the groove comprises a first groove provided at a fixed distance from a second groove on the extension of the rotation axis,
the first groove extends in a first direction orthogonal to a second direction in winch the second groove extends,
the combined magnetic wire further comprises:
   a first combined magnetic wire incorporated in the first groove; and
   a second combined magnetic wire incorporated in the second groove, and
the pickup coil comprises:
   a first pickup coil surrounding the first combined magnetic wire; and
   a second pickup coil surrounding the second combined magnetic wire.

5. The rotation detection device according to claim 1, wherein the multi-layer circuit board comprises a multi-layer wiring structure in which a wiring layer and an insulating layer are stacked alternately,
the rotation detection device further comprises a stopper fitted in an end of the groove, and a length of the groove from a center of the multi-layer circuit board to the stopper is L/2, where L is a length of the combined magnetic wire.

6. The rotation detection device according to claim 5, wherein the stopper is a ferrite embedded layer.

7. A rotation detection device comprising:
a magnet for detection mounted on a rotating body rotating about a rotation axis; and
a detector configured to detect rotation of the rotating body,
the detector comprising:
   a multi-layer circuit board disposed opposite to the magnet for detection;
   a combined magnetic wire provided at an interlayer of the multi-layer circuit board, disposed on an extension of the rotation axis, and exhibiting a large Barkhausen effect;
   a pickup coil comprising wirings on the multi-layer circuit board, and a conductor with which through holes provided in the multi-layer circuit board are filled, the pickup coil surrounding the combined magnetic wire; and
   cylindrical soft magnetic bodies fitted to both ends of the combined magnetic wire.

8. The rotation detection device according to claim 4, wherein the multi-layer circuit board is a disk-shaped substrate having a center axis on the extension of the rotation axis,
the first pickup coil is orthogonal to the second pickup coil on the center axis of the circuit board, and
the first pickup coil and the second pickup coil are uniformly wound respectively around the first combined magnetic wire and the second combined magnetic wire along an entire length of the first combined magnetic wire and the second combined magnetic wire.

9. The rotation detection device according to claim 1, wherein the multi-layer circuit board comprises a soft magnetic layer on a first main surface opposite to the magnet for detection.

10. The rotation detection device according to claim 1, wherein the multi-layer circuit board comprises soft magnetic layers on both sides of the multi-layer circuit board.

11. The rotation detection device according to claim 1, further comprising a processing circuit configured to process a pulse voltage that is generated from the pickup coil, and to count a number of revolutions, the processing circuit being mounted on the multi-layer circuit board.

12. A method of manufacturing a rotation detection device that comprises:
a magnet for detection mounted on a rotating body rotating about a rotation axis; and
a detector disposed opposite to the magnet for detection, to detect rotation of the rotating body,
the detector comprising:
   a multi-layer circuit board;
   a groove provided in an interlayer of the multi-layer circuit board, having a center on an extension of the rotation axis, and being orthogonal to the rotation axis;
   a combined magnetic wire incorporated in the groove and exhibiting a large Barkhausen effect; and
   a pickup coil comprising wirings on the multi-layer circuit board, and a conductor with which through holes are filled, the pickup coil surrounding the combined magnetic wire,
the method of manufacturing the rotation detection device comprising:

manufacturing the multi-layer circuit board, the manufacturing the multi-layer circuit board comprising:
    forming the pickup coil comprising the wirings and the conductor with which the through holes are filled;
    forming a laminated body comprising the groove for insertion into which the combined magnetic wire is inserted; and
    inserting the combined magnetic wire into the groove comprised in the laminated body.

13. The method of manufacturing a rotation detection device according to claim 12, wherein the forming the laminated body comprises:
    stacking and firing a plurality of ceramic green sheets on which wiring layers are formed together with a dummy rod interposed between the wiring layers; and
    pulling out the dummy rod after the firing of the plurality of ceramic green sheets to form a cavity corresponding to the groove.

14. The method of manufacturing a rotation detection device according to claim 13, wherein the inserting the combined magnetic wire comprises:
    covering a periphery of the combined magnetic wire with an insulating film; and
    inserting the combined magnetic wire having the periphery covered with the insulating film into the cavity.

15. The rotation detection device according to claim 1, further comprising a stopper fitted in an end of the groove.

* * * * *